United States Patent [19]
Layton

[11] Patent Number: 5,212,825
[45] Date of Patent: May 18, 1993

[54] SYNTHETIC HETERODYNE DEMODULATOR CIRCUIT

[75] Inventor: Michael R. Layton, Clayton, Calif.

[73] Assignee: Litton Systems, Inc., Woodland Hills,, Calif.

[21] Appl. No.: 610,931

[22] Filed: Nov. 9, 1990

[51] Int. Cl.⁵ .......................................... H04B 10/06
[52] U.S. Cl. ................................. 455/205; 455/306; 455/313; 329/325; 250/227.27; 356/345; 359/191
[58] Field of Search ............... 455/205, 209, 216, 214, 455/226.1, 313, 304, 306, 337; 329/325, 326; 250/227.19, 227.27; 356/345, 358; 359/191, 192, 190

[56] References Cited

U.S. PATENT DOCUMENTS 3,501,705  3/1970  Lukens .................................. 329/326
4,910,800  3/1990  Chung ................................... 455/304

OTHER PUBLICATIONS

Hindin et al., Fiber Optics adopts superheterodyne principles; Electronics vol. 53, #25, Nov. 20, 1980, pp. 73–4.

Primary Examiner—Reinhard J. Eisenzopf
Assistant Examiner—Philip J. Sobutka
Attorney, Agent, or Firm—Elliott N. Kramsky

[57] ABSTRACT

An improved synthetic heterodyne demodulator circuit. The circuit is arranged to accept the output signal s(t) from an interferometric sensor with large amplitude sinusoidal phase modulation (phase-generated carrier). The phase modulation amplitude is adjusted such that a selected pair of odd and even carrier harmonics are equal. The quadrature signal components are first extracted from the phase-generated carrier using standard homodyne techniques. The quadrature signal components are then used to AM-modulate a pair of equal-amplitude quadrature carrier components at an arbitrary frequency $\omega_c$, and summed. The result is a conventional PM modulated carrier which can be demodulated using standard FM techniques, followed by integration, to recover with high fidelity the sensed information.

21 Claims, 4 Drawing Sheets

SYNTHETIC HETERODYNE DEMODULATOR CIRCUIT

BACKGROUND

1. Field of the Invention

The present invention relates to methods and apparatus for linear demodulation of fiber optic interferometric sensor signals. More particularly, this invention pertains to an improved synthetic heterodyne demodulator circuit.

2. Description of the Prior Art

Primarily two methods have been suggested by the prior art for the linear demodulation of fiber optic sensor signals. The first of these, "synthetic heterodyne" is described in U.S. patent Ser. No. 4,436,425 of James H. Cole entitled "Signal Waveform Detector Using Synthetic FM Demodulation" and in the article of James H. Cole, B.A. Danver and J.A. Bucaro entitled "Synthetic-Heterodyne Interferometric Demodulation", *IEEE J. Quantum Elec.*, QE-18 694–697, April 1982. The other method, "Passive Homodyne" is discussed in the article of A. Dandridge, A.B. Tveten and T.G. Giallorenzi entitled "Homodyne Demodulation Scheme For Fiber Optic Sensors Using Phase Generated Carrier", *IEEE J. Quantum Elec.*, QE-18, 1647–1653, October 1982.

Both of the above-described methods process a signal of the form:

$$s(t) = 1 + \gamma \cos(B \sin \omega_m t + \psi(t)) \quad (1)$$

such that the information of interest $\psi(t)$ is recovered with high fidelity. (Various methods are known for generating the above-described carrier signal in a fiber optic interferometric sensor).

In the passive homodyne demodulation approach, the carrier is first multiplied by synchronous reference signals $x(t) = \sin \omega_m t$, and $y(t) = \cos 2\omega_m t$. The pair of signal products are then lowpass filtered, resulting in baseband signals proportional to the $\sin \psi(t)$ and $\cos \psi(t)$, respectively. This quatrature pair of signal components is then differentiated, cross-multiplied and differenced, resulting in a signal proportional to the time derivative of $\psi(t)$. After integration, the desired signal $\psi(t)$ is produced.

In the synthetic heterodyne method, the carrier is filtered with a pair of bandpass filters centered at $\omega_m$ and $2\omega_m$. The bandpass filter outputs are then multiplied by synchronous reference signals of the form $\cos 2\omega_m t$ and $\sin \omega_m t$, respectively. The resulting products, each of which contains a component at $3\omega_m t$, are then filtered with bandpass filters centered at $3\omega_m t$ and then summed. This process results in a conventional phase-modulated (PM) carrier at $3\omega_m t$, which is then demodulated using standard FM demodulation techniques followed by integration. The entire signal processing chain results in linear recovery of $\psi(t)$, the signal of interest.

Both of the known methods possess serious shortcomings. The passive homodyne circuit requires two differentiators, four analog multipliers, two lowpass filters, a summer and an integrator. Furthermore, the scale factor of that circuit will be directly proportional to the amplitude of the incoming carrier unless automatic gain control (AGC) is provided. Generally, the AGC is placed at the input, prior to the first pair of multipliers. Either direct rectification (diode AM envelope detector) or a like method is employed to measure the amplitude of the incoming carrier. Means are then provided for adjusting the carrier to a predetermined peak level prior to processing. An additional multiplier is usually required to control the carrier level.

The two differentiator stages must be stable and well-matched. Otherwise, the demodulation process will become non-linear. Differentiator circuits can be tricky to design, particularly when wide bandwidths are required.

The synthetic heterodyne method requires four bandpass filters, two multipliers, a summer, an FM demodulator and an integrator. (Assuming that the FM demodulator incorporates some form of hard limiter at the front end, a separate AGC block is not required to remove scale factor fluctuations caused by variations in carrier amplitude.)

The bandpass filter requirement includes: one filter at frequency $\omega_m$, one at frequency $2\omega_m$ and two filters at frequency $3\omega_m$. Although the design of each of such filters is straightforward, this requirement adds to circuit complexity and cost. The two filters at $3\omega_m$ must be well-matched and must track over temperature or non-linearities will appear in the demodulation process. The gain stabilities of the filters at $\omega_m$ and $2\omega_m$ are also critical since any variation will result in unbalanced contributions from the quadrature components to the synthesized FM sidebands.

An additional shortcoming of the synthetic heterodyne method is the requirement that the FM carrier frequency be fixed at three times the original carrier frequency. This may preclude operation at FM carrier frequencies where performance is optimal. It may also result in crosstalk problems since the FM demodulator is operating at the third harmonic of a frequency that is present at high levels elsewhere in the circuit.

SUMMARY OF THE INVENTION

The present invention addresses and overcomes numerous problems of the prior art as described above by providing, in a first aspect, a method for recovering the phase-modulated sideband $\psi(t)$ of the output signal from an interferometric fiber sensor with large amplitude carrier phase modulation, such signal being of the form $s(t) = S_o(1 + \gamma \cos(B \sin \omega_m t + \psi(t)))$ where $S_o$ is a dimensional constant, $\gamma$ is the fringe visibility of the interferometer, B is the phase modulation amplitude and $\omega_m$ is the phase-modulation angular frequency.

In its first aspect, the in-phase and quadrature components of teh signal are formed. Thereafter, those components are lowpass filtered to remove all modulation at $\omega_m$. The filtered quadrature component is then mixed with a signal of the form $\sin \omega_c t$ where $\omega_c$ is an arbitrary frequency and the filtered in-phase component is mixed with a signal of the form $\cos \omega_c t$. The two resulting signals are then summed to form a modulated signal that is then demodulated to obtain $\psi(t)$.

In a second aspect of the invention, a method is again provided for recovering $\psi(t)$. The d.c. component of s(t) is first removed. Thereafter, the resulting signal is mixed with an AM modulated carrier of the form $\sin N\omega_m t \sin \omega_c t$ where N is an odd integer and $\omega_c$ is arbitrary to create a first mixed signal and mixed with an AM modulated carrier of the form $\cos(m\omega_m t)$ where M is an even integer to create a second mixed signal. The two signals are then summed to form a modulated signal that is then applied to a bandpass filter centered at $\omega_c$. The modulated signal is then applied to a bandpass filter centered at $\omega_c$ and then demodulated to obtain $\psi(t)$.

In a third aspect of the invention, another method is provided for recovering $\psi(t)$. This method parallels the prior-described method for the most part. However, as opposed to the prior method in which the in-phase and quadrature components are separately mixed and the result summed to form a modulated signal, such steps are replaced by the single step of mixing s(t) with an AM modulated carrier of the form cos $M\omega_m$tcos $\omega_c$t+sin $N\omega_m$t sin $\omega_c$t where M is an even integer and N is an odd integer.

In still another aspect, the invention provides apparatus for recovering the phase-modulated sideband $\psi(t)$ of the output signal s(t) from an interferometric fiber sensor with a large amplitude carrier phase modulation of the above-described form. Means are provided for receiving the signal. Means are engaged thereto for forming the in-phase and quadrature components of s(t) and for removing all $\omega_m$ modulation therefrom. Means are additionally provided for mixing the quadrature component with a signal of the form sin $\omega_c$t and for mixing the in-phase component with a signal of the form cos $\omega_c$t where $\omega_c$ is an arbitrary frequency. Means are additionally provided for summing the signals to form a modulated signal. Finally, means are provided for demodulating the modulated signal to obtain $\psi(t)$.

In yet a further aspect of the invention, apparatus is again provided generally in accordance with the preceding but differing insofar as means are initially provided for removing the d.c. signal and for mixing the resulting signal with AM modulated carriers of the form sin $N\omega_m$tsin$\omega_c$t and cos $M\omega_m$tcos$\omega_c$t where N is an odd integer, M is an is an even integer and $\omega_c$ is an arbitrary frequency to form first and second mixed signals. Means are provided for summing the mixed signals and a bandpass filter centered at $\omega_c$ is arranged to accept the summed signal. Finally, means are provided for demodulating the last-named signal to obtain $\psi(t)$.

In a final aspect, apparatus generally in accordance with the description of the prior paragraph is provided. However, unlike the apparatus described above which separately mixes the in-phase and quadrature components and then sums them to form a modulated signal, in this aspect means are provided for mixing s(t) with an AM modulated carrier of the form cos $M\omega_m$tcos $\omega_c$t+sin $N\omega$tsin $\omega_c$t where M is an even integer, N an odd integer and $\omega_c$ an arbitrary frequency.

The foregoing and additional features and advantages of the present invention will become further apparent from the detailed description that follows. This description is accompanied by a set of drawing figures. Numerals of the drawing figures, corresponding to numerals of the written description, point to the various features of the invention. Like numerals refer to like features throughout both the written description and the drawings.

DETAILED DESCRIPTION

Figure 1:
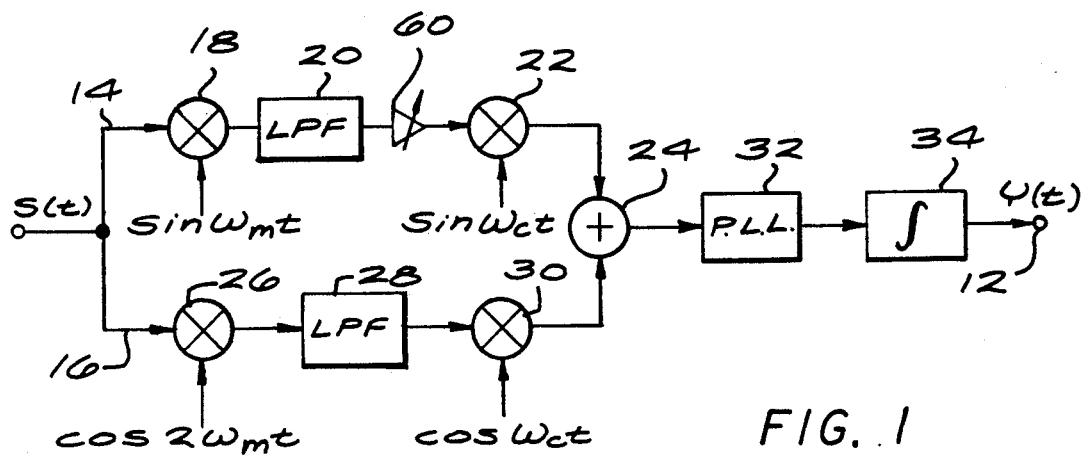
FIG. 1 is a schematic diagram of a circuit for an improved synthetic heterodyne demodulator in accordance with the invention.

FIG. 1 is block diagram of an improved synthetic heterodyne demodulator circuit in accordance with the invention. As shown in the figure, the circuit includes an input port 10 for accepting a received signal s(t) and an output port 12 that receives the signal as processed by the circuitry. The method of the present invention has general applicability to fiber optic sensors of all types, including fiber optic rotation sensors (gyroscopes).

A wide range of fiber optic sensors output a signal of the form s(t)=$S_o$(1+$\gamma$cos$\theta$t).

Where $S_o$ is a dimensional constant, $\gamma$ is the fringe visibility of the interferometer, and $\theta$ is the relative optical phase between the two interfering light beams.

The sensitivity of the interferometer is a maximum when $\theta$ is equal to $\pi/2$, and is zero when $\theta$ is equal to 0. This variation in sensitivity as a function of $\theta$ is commonly referred to as "signal fading". The phase difference between the optical beams must therefore be maintained at $\pi/2$ ("phase quadrature") in order to achieve maximum sensitivity and linearity. (Note that an equally acceptable operating point is $3\pi/2$, which simply introduces a change in sign of the output). Although active feedback techniques can be employed in experimental fiber optic sensors, this is not a viable approach to low-cost fiber optic systems employing multiple, remote, passive sensors.

One technique which successfully eliminates signal fading, yet does not require active feedback, is to impress a large amplitude, high frequency modulation on the relative phase between optical beams. This results in a detected signal of the form:

$$s(t)=S_o(1+\gamma cos(Bsin\ \omega_m t+\psi(t))$$

where Bsin $\omega$t is the large amplitude carrier phase modulation and $\psi(t)$ is the signal of interest.

The large amplitude carrier phase modulation causes the phase difference between optical beams to oscillate through a large angle over time periods that are short relative to changes in the sensed information. This guarantees that the interferometer always spends at least a portion of time in its quadrature state where sensor response is optimal. The detected signal, however, is in the form of phase modulation sidebands. In the present invention, this sideband information is recovered from the detected optical carrier signal. More specifically, an output voltage directly proportional to $\psi(t)$ is derived from the above carrier using the processes and operations illustrated and discussed below.

The phase-generated carrier can be impressed on the interferometer signal by means of a phase modulator/compensator in unbalanced sensor systems ($\tau$>1 ns) or using an FM-modulated laser and slightly unbalanced sensors ($\tau$approximately equal to 100 ps) in balanced sensor systems. The phase-generated carrier is achieved in a gyro using a phase modulator in a gyro sense loop. Sinusoidal phase modulation rather than frequency modulation is employed in fiber optic systems due to the practical difficulties of frequency shifting a beam of light within a fiber.

The present invention operates upon s(t) by means of hardware of minimal complexity to recover $\psi(t)$, the signal of interest. This is accomplished by applying s(t) to circuitry that first extracts the in-phase and quadrature components. Thereafter, the in-phase and quadrature components are employed to amplitude modulate the in-phase and quadrature components of an arbitrary carrier $\omega_c$ and combine the two amplitude-modulated components into a signal that is readily demodulated to yield $\psi(t)$.

Referring to FIG. 1, the circuit of the invention includes two parallel circuit branches 14 (quadrature channel) and 16 (in-phase channel). Referring first to the upper branch 14, the signal s(t) is first multiplexed (mixed) with a signal of the form sin $\omega_m t$ in a multiplier yielding or extracting the quadrature component of s(t). The output of the multiplier 18 is applied to a lowpass filter 20 whose cutoff frequency is set to match the bandwidth of the sensed information. Referring to the lower branch 16, the signal s(t) is applied to a multiplier 26 where it is multiplied (mixed) with a signal of the form cos $2\omega_m t$ extracting the in-phase component of s(t), and the output thereof is applied to a lowpass filter 28 whose cutoff is set to match the bandwidth of the sensed information.

The output of the lowpass filter 20 (quadrature component of s(t)) is applied to a second multiplier 22 where it is used to modulate a signal of the form sin $\omega_c t$, producing at its output a signal which is then added to the output of the lower branch 16 in a summer 24.

The output of the filter 28 (in-phase component of s(t)) is applied to a second multiplier 30 where it is multiplied (mixed) with a signal cos $\omega_c t$. The output of the second multiplier 30 is then applied to the summer 24, forming a signal that is readily demodulated to yield the phase modulated sideband $\psi(t)$.

As an aside, it is well understood by those in the art that the phase modulation amplitude B must be adjusted so that the Bessel functions $J_1(B)$ and $J_2(B)$ are equal. The reason for this is apparent when the carrier signal s(t) is expressed in terms of a Bessel series expansion:

$$s(t) = S_o(1+\gamma(cos(Bsin\omega_m t+\psi(t)))) \ s(t)$$
$$\propto DC + cos(Bsin\omega_m n\psi(t))$$

Neglecting terms at DC, $$s(t) \propto cos\psi(t)cos(Bsin\omega_m t) - sin\psi(t)sin(Bsin\omega_m t)$$

$$s(t) \propto cos\psi(t) \cdot 2\Sigma J_{2k}(B)cos(2k\omega_m t) -$$

$$sin\psi(t) \cdot 2\Sigma J_{2k+1}(B) sin((2k + 1)\omega_m t)$$

Collecting terms at frequency $\omega_m$ and $2\omega_m$, $$s(t) \propto cos\psi(t) \cdot 2J_2(B)cos(2\omega_m t)$$
$$-sin\psi(t) \cdot 2J_1(B)sin(\psi_m t)$$

Figure 7:
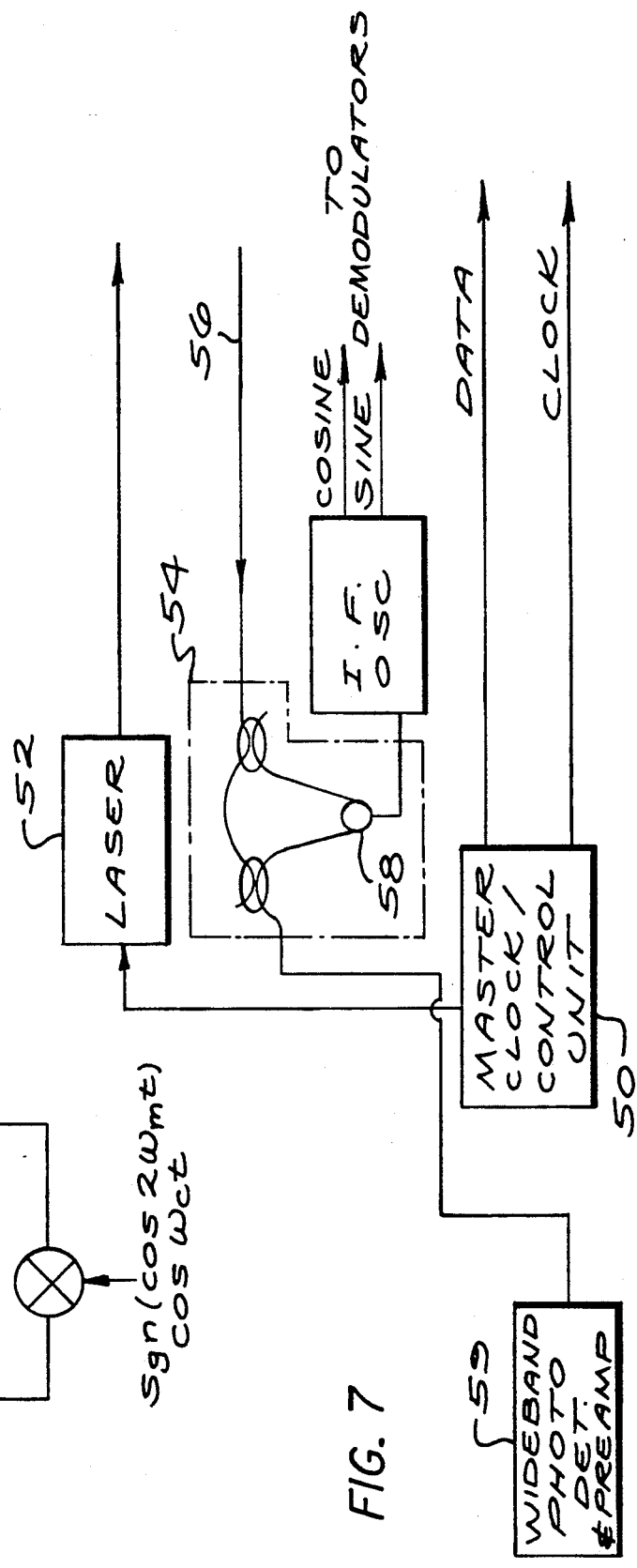
FIG. 7 is a schematic diagram of a conventional arrangement for processing an unbalanced Mach-Zender fiber optic sensor.

The presence of the coefficients $J_1(B)$ and $J_2(B)$ multiplying the terms in the expansion at $\omega_m$ and $2\omega_m$ requires that B be adjusted such that these coefficients are equalized. More specifically, in the present invention such equality of Bessel coefficients must be obtained prior to the upconverting of the quadrature and in-phase components that occurs at the multipliers 22 and 30 respectively. An adjustment to the amplitude B can be made through optical modulation of the interferometer output prior to generation of the electrical signal s(t). FIG. 7 is a schematic diagram of a conventional arrangement for processing an unbalanced Mach-Zender filter optic sensor. As shown, a master clock/control unit 50 determines the optical pulse width and pulse repetition rate and applies the required gate input to a time-gated laser source 52. A Mach-Zender interferometer 54 accepts the output pulse train from the return bus fiber 56 and acts as an optical signal processor that overlaps consecutive optical pulses in time and space. The longer arm of the interferometer 54 includes an optical phase modulator 58 that impresses a high frequency, high level phase modulation onto a delayed replica of the pulse train prior to overlapping it with the undelayed replica at the output, the latter having traversed the short arm of the interferometer. The optical signal applied to a photodetector 59 satisfies the aforesaid Bessel equation equality. A variable gain amplifier 60 is provided in the path 14 for "fine tuning" the electrical signal to the desired equality with considerable exactitude.

Assuming that the carrier modulation B has been properly adjusted, either through optical modulation alone or in combination with gain trim in one of the signal paths 14 or 16, the output signals from lowpass filters 20 and 28 are proportional to $-sin \ \psi(t)$ and $cos \ \psi(t)$, respectively. The output from lowpass filter 20, $-sin \ \psi(t)$, applied to one input of the multiplier 22 whose other input is a sinusoidal voltage of arbitrary frequency, $sin \ \omega_c t$, yields an output of the form:

$$X(t) = -sin \ \psi(t)sin \ \omega_c(t)$$

The output of the lowpass filter 28, $cos \ \psi(t)$, applied to one input of the multiplier 30 whose other input is a cosinusoidal voltage defined by $cos \ \omega_c t$, produces an output of the form:

$$y(t) = cos \ \psi(t)cos \ \omega_c t$$

the outputs from multipliers added together in the summer 24, produce an output signal defined by:

$$g(t) = cos \ \psi(t)cos \ \omega_c t - sin \ \psi(t)sin \ \omega_c t$$

$$g(t) = cos(\omega_c t + \psi(t))$$

The signal produced is in the form of a high frequency carrier $\omega_c t$ that is phase-modulated by the information of interest $\psi(t)$. Since the desired information manifests itself as variations in the zero-crossings of the carrier, it can be readily demodulated by standard FM demodulation techniques.

To demodulate the above-defined signal, such signal is first applied to a phase-locked loop FM demodulator 32 that typically has a comparator front end that "squares-up" the sinusoidal input to remove all AM modulation as the fringe visibility $\gamma$ may be time-varying. varying. The output of the phase-locked loop 32 is proportional to the instantaneous frequency difference between the input and the (internal) voltage controlled oscillator. Since frequency is the time derivative of phase, the output of the phase-locked loop 32 is proportional to the time derivative of $\psi(t)$, the signal of interest.

The signal is then applied to an integrator 34 that produces an output $v_{out}(t) = K\psi(t)$ that is directly proportional to the signal of interest.

It should be noted that no bandpass filters or differentiators have been employed. Furthermore, the carrier (at $\omega_c$) need not be related to $\omega_m$. Lowpass filters are much easier to design and fabricate than bandpass filters. Furthermore, one could also use sin $3\omega_m t$ and cos $2\omega_m t$ for the inputs to the multipliers 18 and 26 respectively as long as the carrier phase modulation amplitude B were adjusted such that the magnitudes of the Bessel functions $J_2(B)$ and $J_3(B)$ (corresponding to the harmonics of the carrier) are equal. In fact, in general one could utilize any odd and even pair of harmonics sin $N\omega_m t$ and cos $M\omega_m t$, where N is an odd integer and M is an even integer, with the carrier phase modulation amplitude B adjusted such that $J_N(B)$ equals $J_M(B)$. A simple and practical method for extracting the quadrature components from the carrier is to utilize sgn(sin $\omega_m t$) as the input to multiplier 18, and sgn(cos $2\omega_m t$) as the input to multiplier 26, where the sgn(x) is defined by:

$$sgn(x) = \begin{matrix} +1, x > 0 \\ -1, x < 0 \end{matrix}$$

Figure 6:
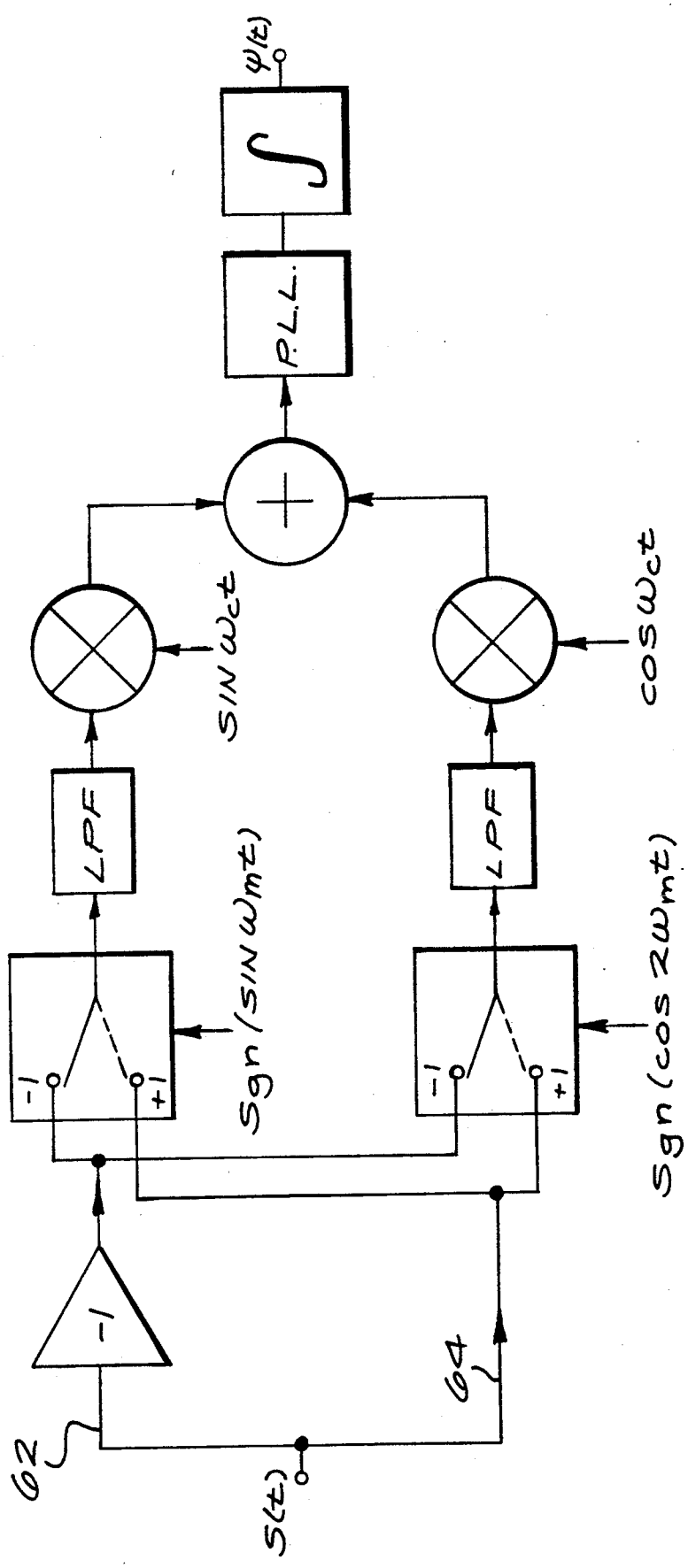
FIG. 6 is a schematic diagram of an improved heterodyne circuit in accordance with a further alternative embodiment of the invention.

The multiplication operation can therefore be accomplished using switches and inverters (the latter to obtain positive and negative versions of the signal) rather than analog multipliers. FIG. 6 is a block diagram of an alternative embodiment of the invention that employs switches rather than analog multipliers to extract the quadrature signal components.

The improved synthetic heterodyne circuit requires a minimum of components while maintaining high performance demodulation. Conversion to a PM carrier and the resultant demodulation can be achieved with two inverters, two switches, two multipliers, a summer, a phase-locked loop and an integrator as shown in FIG. 6. All of the advantages of PM demodulation are preserved. Automatic gain control is achieved by utilizing a phase-locked loop demodulator 32. In contrast to the synthetic heterodyne methods of the prior art, the improved circuit requires no bandpass filters. Furthermore, the frequency of the synthesized PM carrier is arbitrary.

For sensor array applications where more than one sensor must be demodulated, many of the required circuit operations can be performed in a common module, further simplifying the circuitry. For such systems, the demodulator consists of one multiplier, one bandpass filter, a phase-locked loop and an integrator.

In contrast to the passive homodyne method, the present invention eliminates any need for matched differentiators and automatic gain control. This is accomplished with fewer components and less complexity as well.

Figure 2:
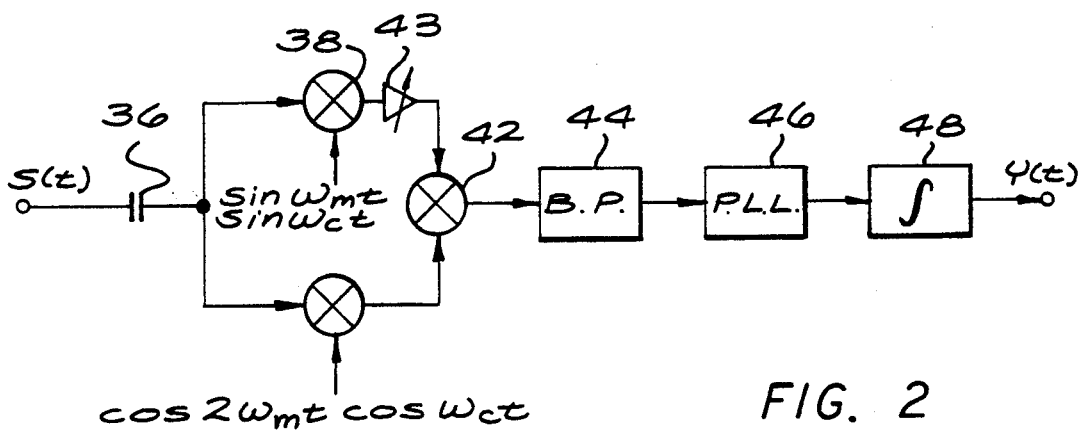
FIG. 2 is a schematic diagram of a circuit for an improved synthetic heterodyne demodulator in accordance with an alternative embodiment of the invention.

FIG. 2 is a block diagram of an improved synthetic heterodyne demodulator in accordance with a second embodiment of the invention. Such an alternative embodiment accomplishes the same end result as the approach taken above. However, the apparatus of FIG. 2 is somewhat simplified in terms of the required circuit complexity.

Referring to FIG. 2, the input s(t) is a.c. coupled through a capacitor 36 to remove the d.c. component and is then simultaneously applied to parallel multipliers 38 and 40 wherein it is multiplied by the AM modulated carriers sin $\omega_m t \cdot \sin\omega_c t$ and cos($2\omega_m t$) cos$\omega_c t$. As a result of the first multiplication, the component $\gamma J_1(B) \sin \psi(t)$ is effectively extracted from s(t), and at the same time, used to AM-modulate the carrier sin $\omega_c t$. Likewise, the multiplication occurring at the multiplier 40 similarly performs a filtering function, resulting in an output $\gamma J_2(B)\cos \psi(t)\cos \omega_c t$. Additional terms at frequencies $\omega_c \pm k\omega_m t$ where k is an integer, are also generated during the multiplication operation.

The two outputs are combined in a summer 42, resulting in a signal of the form:

$$s'(t) = \gamma J_2(B)\cos\psi(t)\cos\omega_c t - \gamma J_1(B)\sin\psi(t)\sin\omega_c t + \text{higher order terms.}$$

Once again, optical adjustment of B and/or adjustment of a gain trimming amplifier 43 in one of the parallel signal paths insures that the coefficients $J_1(B)$ and $J_2(B)$ are equal. The output from summer 42 is filtered with bandpass filter 44 centered at $\omega_c$, stripping off all undesired D.C. and higher order terms resulting from the multiplication operation. The output of the bandpass filter is:

$$s''(t) = \gamma J_1(B)\cos(\omega_c t + \psi(t))$$

This signal is applied to a phase-locked loop FM demodulator 46 that is arranged to lock at $\omega_c$. The output is applied to integrator 48, resulting in an output voltage that is proportional to $\psi(t)$.

Figure 4:
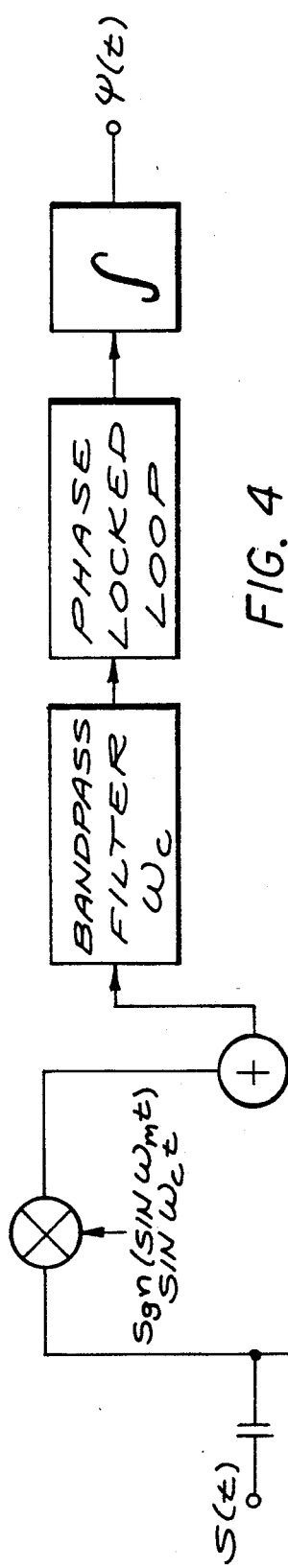
FIG. 4 is a schematic diagram of a circuit for an improved synthetic heterodyne demodulator in accordance with a further alternative embodiment of the invention.
Figure 5:
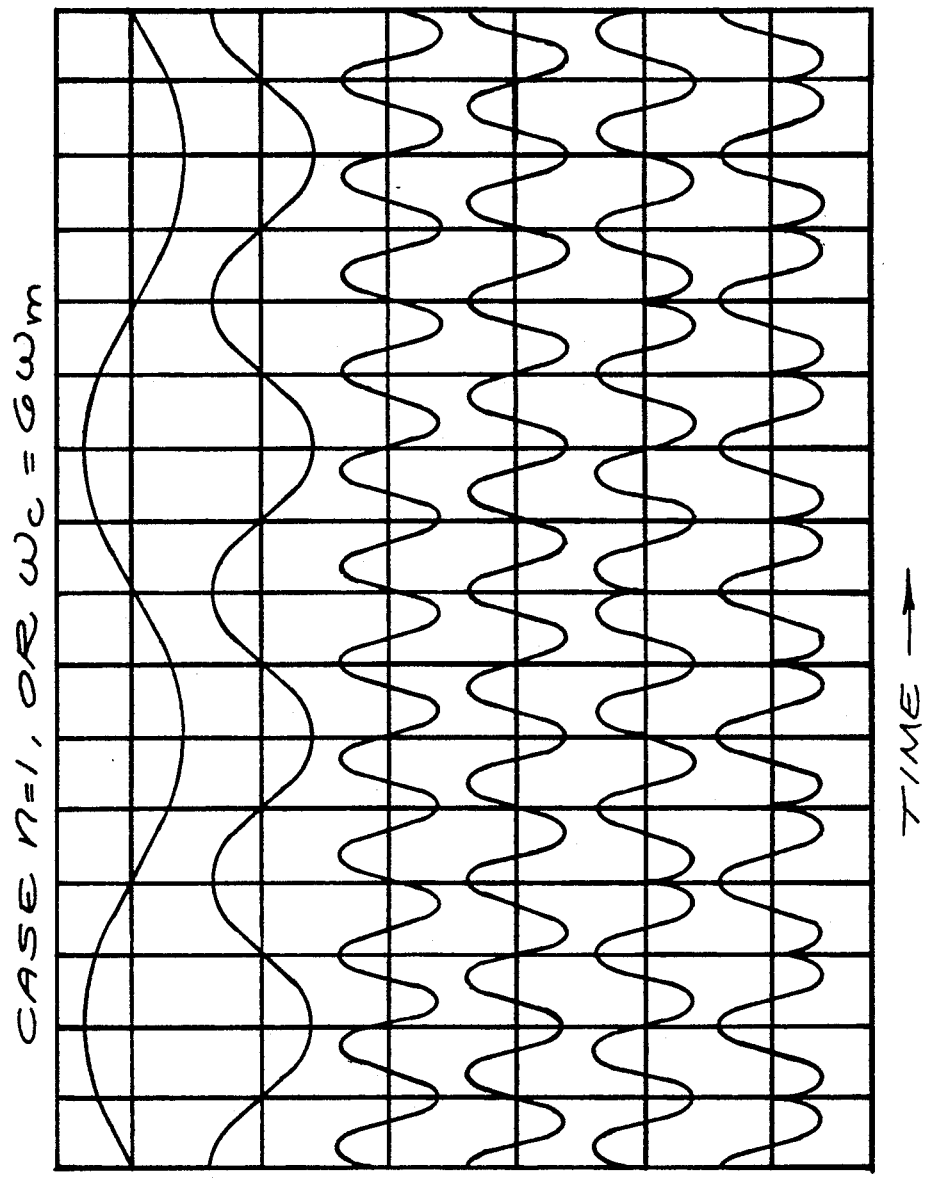
FIG. 5 is a timing diagram illustrating the relationship between quadrature carrier components for the embodiment according to FIG. 4.

The method discussed with regard to the apparatus of FIG. 2 could also function with AM modulation at sin $3\omega_m t$ and cos $2\omega_m t$. For this case, B must be adjusted such that $J_2(B)$ equals $J_3(B)$. Furthermore, one might employ phase-shift keyed signals of the form sgn(sin $\omega_n t$)·sin $\omega_c t$ in place of sin $\omega_m t \cdot \sin \omega_c t$ and sgn(cos $2\omega_m t$)·cos $\omega_c t$ in place of cos $2\omega_m t \cdot \cos \omega_c t$, choosing $\omega_c$ such that $\omega_c = 2(2n+1)\omega_m$, n = 0, 1, 2, ... A block diagram of an improved synthetic heterodyne demodulator employing such phase-shift-keyed signals is shown in FIG. 4. An example of a suitable pair of phase-shift keyed carrier inputs is shown in FIG. 5. The AM modulated (or phase-shift keyed) multiplier inputs can be generated in one functional block in a multiplexed sensor system and distributed to each respective demodulator board. The only limitation is that they must remain phase-synchronous relative to the carrier.

Figure 3:
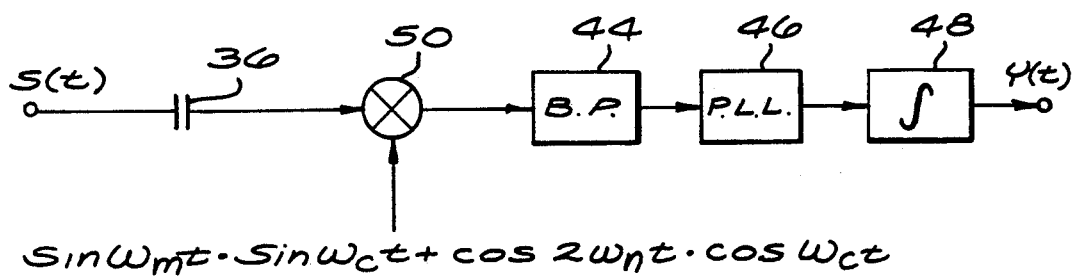
FIG. 3 is a schematic diagram of a circuit for an improved synthetic heterodyne demodulator in accordance with a further alternative embodiment of the invention.

FIG. 3 is a block diagram of another alternative embodiment of the present invention. As before, the signal s(t) is a.c. coupled and applied to a multiplier 50. The other input to the multiplier is an AM modulated signal of the form sin $\omega_m t \cdot \sin \omega_c t + \cos 2\omega_m t \cdot \cos \omega_c t$. Thereafter, the signal is processed in a like manner to that of the prior illustrated embodiment, producing, at the output of the circuit, a voltage proportional to $\psi(t)$.

FIG. 6 is a block diagram of another alternative embodiment of the present invention. The signal s(t) is A.C. coupled, after which is routed to parallel paths 62 and 64. A unity-gain inverter is placed in path 62 to invert the signal. The bandwidth of this inverter is sufficiently large such that no phase shifts occur relative to the other parallel signal path. The non-inverted and inverted forms of s(t) are then tied to the respective poles of a pair of single-pole, doublethrow (SPDT)

switches as indicated in FIG. 6. When the control input to the switch is +1 (or +V), the output is connected directly to the non-inverted form of s(t). When the input is −1 (or −V), the output is connected to the inverted form of s(t).

A signal of the form sgn(sin $\omega_m t$) is used to control the switch in path 62 while one of the form sgn(cos $2\omega_m t$) is used to control the switch in path 64. This operation is functionally similar to that performed in previous embodiments of the invention utilizing analog multipliers. However, it is simpler and less costly to implement in a practical circuit. The outputs of the respective SPDT switches are lowpass filtered, after which they are proportional to the quadrature signal components sin $\psi(t)$ and cos $\psi(t)$. These quadrature signal components are used to amplitude-modulate a pair of equal-amplitude quadrature carrier components sin $\omega_c t$, followed by summation, resulting in a conventional PM carrier. The desired information $\psi(t)$ is recovered by employing a phase-locked loop FM demodulator followed by an integrator.

Thus, as has been shown, the present invention provides improved apparatus and a method for the linear demodulation of fiber optic sensor signals. By utilizing the improved synthetic heterodyne demodulator circuit of the invention, one may realize significant advantages over the prior art in terms of ease of manufacture and economy.

While this invention has been described with reference to its presently preferred embodiments, it is not limited thereto. Rather, this invention is limited only insofar as defined by the following set of claims and includes within its scope all equivalents thereof.

What is claimed is:

1. A method for recovering the phase modulated sideband $\psi(t)$ of the output signal s(t) from an interferometric fiber sensor with large amplitude carrier phase modulation, said signal being of the form s(t)=$S_o$(1+$\gamma$cos(Bsin $\omega_m t + \psi(t)$)) where:
   $S_o$=a dimensional constant;
   $\gamma$=fringe visibility of the interferometer;
   B=phase modulation amplitude; and
   $\omega_m$=phase modulation angular frequency comprising steps of:
   a) forming the in-phase and quadrature components of said signal; then
   b) lowpass filtering said in-phase and quadrature components to remove all modulation at $\omega_m$; then
   c) mixing said filtered quadrature component with a signal of the form sin $\omega_c t$ where $\omega_c$ is an arbitrary frequency; and
   d) mixing said filtered in-phase component with a signal of the form cos $\omega_c t$; then
   e) summing said last-named signals to form a modulated signal; and
   f) demodulating said modulated signal to obtain $\psi(t)$.

2. A method as defined in claim 1 wherein the step of forming said in-phase and quadrature components further includes the steps of:
   a) multiplying s(t) by sin N$\omega_m t$ where N is an odd integer to form said quadrature component; and
   b) multiplying s(t) by cos M$\omega_m t$ where M is an even integer to form said in-phase component.

3. A method as defined in claim 2 wherein the step of demodulating further includes the steps of:
   a) frequency demodulating said modulated signal; and then
   b) integrating said frequency demodulated signal.

4. A method as defined in claim 3 wherein the steps of frequency demodulating is characterized by applying said modulated signal to a phase locked loop.

5. A method as defined in claim 4 wherein N=1 and M=2.

6. A method as defined in claim 1 wherein the step of forming said in-phase and quadrature components further including the steps of:
   a) inverting s(t); then
   b) gating said inverted and non-inverted s(t) through a first and second single-pole, double-throw switch; and
   c) controlling said first switch with a signal of the form sgn(sin N$\omega_m t$) where N is an odd integer to form said quadrature component; and
   d) controlling said second switch with a signal of the form sgn(cos M$\omega_m t$) where M is an even integer to form said in-phase component.

7. A method for recovering the phase modulated sideband $\psi(t)$ of the output signal s(t) from an interferometric fiber sensor with large amplitude carrier phase modulation, said signal being of the from s(t)=$S_o$(1+$\gamma$cos(Bsin $\omega_m t + \psi(t)$)) where:
   $S_o$=a dimensional constant;
   $\gamma$=fringe visibility of the interferometer;
   B=phase modulation amplitude; and
   $\omega_m$=phase modulation angular frequency comprising the steps of:
   a) removing the d.c. component of said signal; then
   b) mixing said signal with an AM modulated carrier of the form sin(N$\omega_m t$)sin $\omega_c t$ where N is an odd integer and $\omega_c$ is arbitrary to create a first mixed signal; and
   c) mixing said signal with an AM modulated carrier of the form cos(M$\omega_m t$)cos $\omega_c t$ where M is an even integer to create a second mixed signal; then
   d) summing said first and second mixed signals to form a modulated signal; then
   e) applying said modulated signal to a bandpass filter centered at $\omega_c$; and then
   f) demodulating said filtered modulated signal to obtain $\psi(t)$.

8. A method as defined in claim 7 wherein the step of demodulating further includes the steps of:
   a) applying said filtered modulated signal to a phase locked loop arranged to lock at $\omega_c$; and then
   b) integrating the output of said phase-locked loop.

9. A method as defined in claim 8 wherein N=1 and M=2.

10. A method for recovering the phase modulated sideband $\psi(t)$ of the output signal s(t) from an interferometric fiber sensor with large amplitude carrier phase modulation, said signal being of the from s(t)=$S_o$(1+$\gamma$cos(Bsin $\omega_m t + \psi(t)$)) where:
    $S_o$=a dimensional constant;
    $\gamma$=fringe visibility of the interferometer;
    B=phase modulation amplitude; and
    $\omega_m$=phase modulation angular frequency comprising the steps of:
    a) removing the d.c. component of said signal; then
    b) mixing said signal with a phase-shift keyed carrier of the form sgn(sin N$\omega_m t$)sin $\omega_c t$ where N is an odd integer and $\omega_c$ is arbitrary to create a first signal; and
    c) mixing said signal with a phase shift keyed carrier of the form sgn(cos M$\omega_m t$)cos $\omega_c t$ where M is an even integer to create a second signal; then d) summing said first and second signals to form a modulated signal; then e) applying said modulated signal to a bandpass filter centered at $\omega_c$; and then f) demodulating said filtered modulated signal to obtain $\psi(t)$.

11. A method for recovering the phase modulated sideband $\psi(t)$ of the output signal s(t) from an interferometric fiber sensor with large amplitude carrier phase modulation, said signal being of the form $s(t)=S_o(1+\gamma\cos(B\sin \omega_m t+\psi(t)))$ where:

$S_o$ = a dimensional constant;

$\gamma$ = fringe visibility of the interferometer;

B = phase modulation amplitude; and $\omega_m$ = phase modulation angular frequency comprising the steps of:

a) removing the d.c. component of said signal; then b) mixing said signal with an AM modulated carrier of the form $\cos M\omega_m t \cos \omega_c t + \sin N\omega_m t \sin \omega_c t$ where N is an odd integer, M is an even integer and $\omega_c$ is arbitrary to form a modulated signal; then c) applying said modulated signal to a bandpass filter centered at $\omega_c$; and then d) demodulating said filtered modulated signal to obtain $\psi(t)$.

12. A method as defined in claim 11 wherein step of demodulating further includes the steps of:

a) applying said filtered modulated signal to a phase locked loop arranged to lock at $\omega_c$; and then b) integrating the output of said phase-locked loop.

13. Apparatus for recovering the phase modulated sideband $\psi(t)$ of the output signal s(t) from an interferometric fiber sensor with large amplitude carrier phase modulation, said signal being of the form $s(t)=S_o(1+\cos(B\sin \omega_m t+\psi(t)))$ where:

$S_o$ = a dimensional constant;

$\gamma$ = fringe visibility of the interferometer;

B = phase modulation amplitude; and $\omega_m$ = phase modulation angular frequency comprising, in combination:

a) means for receiving said signal;

b) means engaged to said last-named means for forming the in-phase and quadrature components of said signal;

c) means for removing all $\omega_m$ modulation from said in-phase and quadrature components;

d) means for mixing said first quadrature component with a signal of the form $\sin \omega_c t$ where $\omega_c$ is an arbitrary frequency;

e) means for mixing said in-phase component with a signal of the form $\cos \omega_c t$;

f) means for summing said last-named signals to form a modulated signal; and g) means for demodulating said modulated signal to obtain $\psi(t)$.

14. Apparatus as defined in claim 13 wherein said means for demodulating further includes:

a) a phase-locked loop arranged to lock at $\omega_c$; and b) means for integrating the output of said phase-locked loop.

15. Apparatus as defined in claim 14 wherein said means for forming the in-phase and quadrature components further includes:

a) means for multiplying s(t) by $\sin N\omega_m t$ where N is an odd integer to form said quadrature component; and b) means for multiplying s(t) by $\cos M\omega_m t$ where M is an even integer to form said in-phase component.

16. Apparatus as defined in claim 14 wherein said means for forming the in-phase and quadrature components further includes:

a) means for inverting s(t);

b) a first and second single-pole double-throw switch for gating said inverted and non-inverted s(t);

c) said first switch being controlled by a signal of the form sgn(sin $N\omega_m t$) where N is an odd integer to form said quadrature component; and d) said second switch being controlled by a signal of the form sgn(cos $M\omega_m t$) where M is an even integer to form said in-phase component.

17. Apparatus for recovering the phase modulated deband $\psi(t)$ of the output signal s(t) from an interferometric fiber sensor with large amplitude carrier phase modulation, said signal being of the form $s(t)=S_o(1+\gamma\cos(B\sin \omega_m t+\psi(t)))$ where:

$S_o$ = a dimensional constant;

$\gamma$ = fringe visibility of the interferometer;

B = phase modulation amplitude; and $\omega_m$ = phase modulation angular frequency comprising, in combination:

a) means for receiving said signal;

b) means for removing the d.c. component of said signal;

c) means for mixing said signal with an AM modulated carrier of the form $\sin N\omega_m t \sin \omega_c t$ where N is an odd integer and $\omega_c$ is an arbitrary frequency to form a first mixed signal; and d) means for mixing said signal with an AM modulated carrier of the form $\cos M\omega_m t \cos \omega_c t$ where M is an even integer to form a second mixed signal;

e) means for summing said first and second mixed signals;

f) a bandpass filter centered at $\omega_c$ arranged to accept said summed signal; and g) means for demodulating said filtered signal to obtain $\psi(t)$.

18. Apparatus as defined in claim 17 wherein said means for demodulating further includes:

a) a phase-locked loop arranged to lock at $\omega_c$; and b) means for integrating the output of said phase-locked loop.

19. Apparatus for recovering the phase modulated sideband $\psi(t)$ of the output signal s(t) from an interferometric fiber sensor with large amplitude carrier phase modulation, said signal being of the form $s(t)=S_o(1+\gamma\cos(B\sin \omega_m t+\psi(t)))$ where:

$S_o$ = a dimensional constant;

$\gamma$ = fringe visibility of the interferometer;

B = phase modulation amplitude; and $\omega_m$ = phase modulation angular frequency comprising, in combination:

a) means for receiving said signal;

b) means for removing the d.c. component of said signal;

c) means for mixing said signal with a phase-shift keyed carrier of the form sgn(sin $N\omega_m t$)sin $\omega_c t$ where N is an odd integer and $\omega_c$ is an arbitrary frequency to form a first signal; and d) means for mixing said signal with a phase-shift keyed carrier of the form sgn(cos $M\omega_m t$)cos $\omega_c t$ where M is an even integer to form a second signal;

e) means for summing said first and second signals;

f) a bandpass filter centered at $\omega_c$ arranged to accept said summed signal; and g) means for demodulating said filtered signal to obtain $\psi(t)$.

20. Apparatus for recovering the phase modulated sideband $\psi(t)$ of the output signal s(t) from an interferometric fiber sensor with large amplitude carrier phase modulation, said signal being of the form $s(t) = S_o(1 + \gamma\cos(B\sin \omega_m t + \psi(t)))$ where:

$S_o$ = a dimensional constant;
$\gamma$ = fringe visibility of the interferometer;
B = phase modulation amplitude; and
$\omega_m$ = phase modulation angular frequency comprising, in combination:

a) means for receiving said signal;
b) means for removing the d.c. component of said signal;
c) means for mixing said signal with an AM modulated carrier of the form $\sin N\omega_m t \sin \omega_c t + \cos M\omega_m t \cos \omega_c t$ where N is an odd integer, M is an even integer and $\omega_c$ is an arbitrary frequency, to create modulated signal; and
d) a bandpass filter centered at $\omega_c$ arranged to accept said modulated signal; and
e) means for demodulating said modulated signal to obtain $\psi(t)$.

21. Apparatus as defined in claim 20 wherein said means for demodulating further includes:

a) a phase locked loop arranged to lock at $\omega_c$; and
b) means for integrating the output of said phase-locked loop.

* * * * *